(12) United States Patent
Buck et al.

(10) Patent No.: US 10,868,231 B2
(45) Date of Patent: Dec. 15, 2020

(54) MICROMECHANICAL COMPONENT AND PRODUCTION METHOD FOR A MICROMECHANICAL COMPONENT

(71) Applicant: Robert Bosch GmbH, Stuttgart (DE)

(72) Inventors: Thomas Buck, Tamm (DE); Fabian Purki, Rutesheim (DE); Kerrin Doessel, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 588 days.

(21) Appl. No.: 15/665,508

(22) Filed: Aug. 1, 2017

(65) Prior Publication Data

US 2018/0062067 A1 Mar. 1, 2018

(30) Foreign Application Priority Data

Aug. 29, 2016 (DE) .................. 10 2016 216 215

(51) Int. Cl.
| | |
|---|---|
| *H01L 41/09* | (2006.01) |
| *H01L 41/053* | (2006.01) |
| *H01L 41/113* | (2006.01) |
| *G01L 1/16* | (2006.01) |
| *G01L 9/00* | (2006.01) |
| *H01L 41/047* | (2006.01) |
| *H01L 41/29* | (2013.01) |

(Continued)

(52) U.S. Cl.
CPC .............. *H01L 41/094* (2013.01); *G01L 1/16* (2013.01); *G01L 9/008* (2013.01); *H01L 41/047* (2013.01); *H01L 41/053* (2013.01); *H01L 41/1132* (2013.01); *H01L 41/1136* (2013.01); *H01L 41/1138* (2013.01); *H01L 41/29* (2013.01); *H01L 41/332* (2013.01); *H04R 17/02* (2013.01); *H04R 2201/003* (2013.01)

(58) Field of Classification Search
CPC ... H01L 41/094; H01L 41/047; H01L 41/053; H01L 41/1132; H01L 41/1136; H01L 41/1138
USPC .......................................... 310/328, 330–332
See application file for complete search history.

(56) References Cited

U.S. PATENT DOCUMENTS

| | | | | |
|---|---|---|---|---|
| 3,813,744 A | * | 6/1974 | Morris | ................... G01V 1/181 29/25.35 |
| 6,262,516 B1 | * | 7/2001 | Fukuda | ............... H01L 41/0946 310/321 |

(Continued)

*Primary Examiner* — Derek J Rosenau
(74) *Attorney, Agent, or Firm* — Norton Rose Fulbright US LLP; Gerard Messina (57) ABSTRACT

A micromechanical component having at least one electromechanical flexible structure, each of which includes a first piezoelectric layer, a first outer electrode situated on a first side of the first piezoelectric layer, a first intermediate electrode situated on a second side, oriented away from the first side, of the first piezoelectric layer, a second piezoelectric layer situated on a side of the first intermediate electrode oriented away from the first piezoelectric layer, and a second outer electrode situated on a side of the second piezoelectric layer oriented away from the first intermediate electrode, the at least one electromechanical flexible structure having in each case a second intermediate electrode that is situated on the side of the first intermediate electrode oriented away from the first piezoelectric layer, between the second piezoelectric layer and the first intermediate electrode.

7 Claims, 4 Drawing Sheets

(51) Int. Cl.
*H01L 41/332* (2013.01)
*H04R 17/02* (2006.01)

(56) References Cited

U.S. PATENT DOCUMENTS

| | | | |
|---|---|---|---|
| 2012/0032553 A1* | 2/2012 | Goyal | F03G 7/005 |
| | | | 310/300 |
| 2012/0057730 A1* | 3/2012 | Fujise | H04R 17/00 |
| | | | 381/190 |
| 2012/0138704 A1* | 6/2012 | Saddoughi | H01L 41/0973 |
| | | | 239/102.2 |
| 2014/0339657 A1 | 11/2014 | Grosh et al. | |

* cited by examiner

MICROMECHANICAL COMPONENT AND PRODUCTION METHOD FOR A MICROMECHANICAL COMPONENT

CROSS REFERENCE

The present application claims the benefit under 35 U.S.C. § 119 of German Patent No. DE 102016216215.2 filed on Aug. 29, 2016, which is expressly incorporated herein by reference in its entirety.

FIELD

The present invention relates to a micromechanical component, a microphone, and a pressure and/or force sensor. The present invention also relates to a production method for a micromechanical component.

BACKGROUND INFORMATION

U.S. Patent Appl. Pub. 2014/0339657 A1 describes microphones that have a multiplicity of electro-mechanical flexible beams for converting sound waves into electrical signals. Each of the flexible beams has a first piezoelectric layer situated between the first outer electrode and an intermediate electrode, and a second piezoelectric layer situated between the intermediate electrode and a second outer electrode.

SUMMARY

The present invention provides a micromechanical component, a microphone, a pressure and/or force sensor, and a production method for a micromechanical component.

The present invention provides possibilities for converting forces and pressures, in particular sound waves, into electrical signals having an increased voltage and/or an increased current strength. As is explained in more detail below, using the micromechanical component according to the present invention (due to the two intermediate electrodes of its at least one electromechanical flexible structure), forces and/or pressures, in particular sound waves, can be converted into electrical signals that can be detected, amplified, and/or evaluated more reliably and using low-cost electronic components.

The present invention therefore also increases the possible uses of piezoelectric layers for converting, detecting, and/or measuring forces and/or pressures, in particular sound waves, such that the equipping of the at least one electromechanical flexible structure with a counter-electrode attached close thereto (back plate), as is used for capacitive flexible sensors, can be omitted. Thus, in a use of the present invention the disadvantages of capacitive flexible sensors, such as a limitation of the mobility of the capacitive flexible sensor due to the counterelectrode, or a signal imprecision caused by an air flow resistance of the counterelectrode, are not present.

In an advantageous specific embodiment of the micromechanical component, an intermediate volume between the first intermediate electrode and the second intermediate electrode is filled at least partly with at least one electrically insulating material, and/or has at least one intermediate gap having air, at least one gas, or a vacuum therein. Such a realization of the intermediate volume between the first intermediate electrode and the second intermediate electrode contributes to the reduction of a "parasitic" capacitance between the first intermediate electrode and the second intermediate electrode. As is explained in more detail below, in this way an initial voltage brought about by a deformation of the respective electromechanical flexible structure can be increased.

Preferably, in the intermediate volume between the first intermediate electrode and the second intermediate electrode, at least one mechanical connecting element made of the at least one electrically insulating material is fashioned, which element extends in each case from the first intermediate electrode to the second intermediate electrode, and limits the at least one intermediate gap having air, the at least one gas, or a vacuum therein. The at least one mechanical connecting element thus brings about a reliable mechanical coupling between the two intermediate electrodes, and at the same time the at least one intermediate gap having air, at least one gas, or a vacuum therein contributes to the reduction of a rigidity of the respective electromechanical flexible structure.

In particular, a plurality of mechanical connecting elements can be fashioned as the at least one mechanical connecting element in the intermediate volume between the first intermediate electrode and the second intermediate electrode, an intermediate gap being formed in each case between two adjacent mechanical connecting elements, the gap having air, the at least one gas, or a vacuum therein. Thus, in addition to a good mechanical coupling of the two intermediate electrodes to one another, a low rigidity of the respective flexible structure is also realized in this specific embodiment of the micromechanical component.

In a further advantageous specific embodiment of the micromechanical component, the second intermediate electrode is electrically connected to the first outer electrode in such a way that the second intermediate electrode and the first outer electrode are at the same potential. An initial voltage brought about by deformation of the first piezoelectric layer and simultaneous deformation of the second piezoelectric layer can in this case be picked out at the respective second outer electrode and at the respective first intermediate electrode. The initial voltage picked off in this way is increased compared to conventional piezoelectric sensor elements, and can therefore be detected, amplified, and/or evaluated more reliably and with lower-cost electronic components.

Advantageously, the micromechanical component has at least one first electrical contact connected electrically to the respective second outer electrode of the at least one electromechanical flexible structure, and at least one second electrical contact electrically connected to the respective first intermediate electrode of the at least one electromechanical flexible structure. The initial voltage, increased in comparison to the existing art, can in this way easily be picked off in this specific embodiment of the micromechanical component.

In a preferred specific embodiment, a multiplicity of etching accesses extend through the second outer electrode, the second piezoelectric layer, and the second intermediate electrode. As is explained more precisely below, this facilitates the formation of the at least one intermediate gap, having air, the at least one gas, or a vacuum therein, in the intermediate volume between the first intermediate electrode and the second intermediate electrode.

The advantages described above are realized both in a microphone and also in a pressure and/or force sensor having such a micromechanical component. It is to be noted that both the microphone and the pressure and/or force sensor can be further developed according to the specific embodiments described above of the micromechanical component.

In addition, a realization of a corresponding production method for a micromechanical component also provides the advantages described above. The production method for a micromechanical component can also be further developed according to the above-described specific embodiments of micromechanical components.

BRIEF DESCRIPTION OF THE DRAWINGS

Further features and advantages of the present invention are explained in the following on the basis of the Figures.

DETAILED DESCRIPTION OF EXAMPLE EMBODIMENTS

Figure 1A:
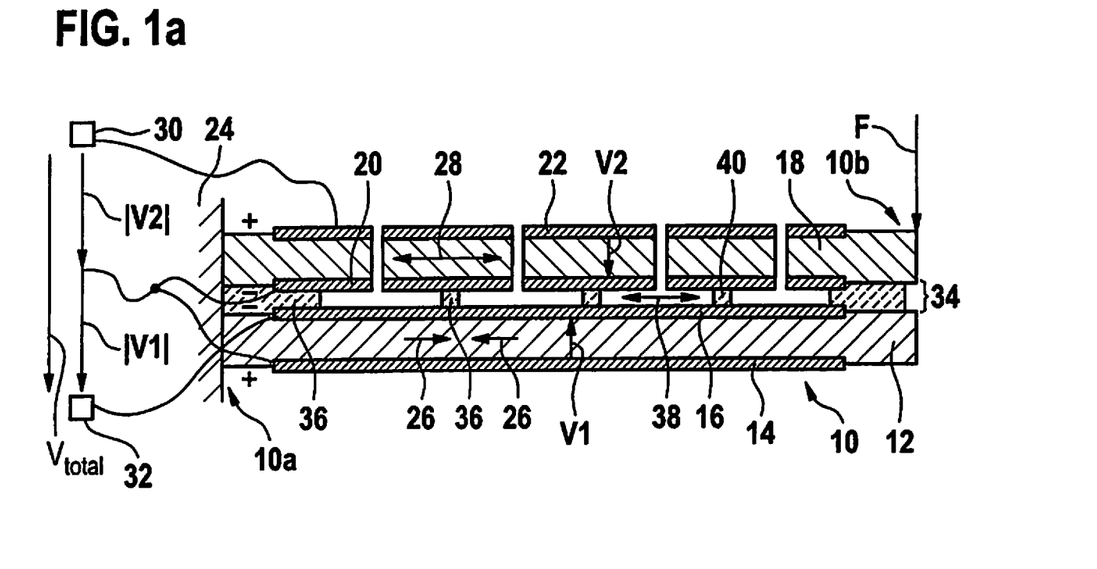
FIGS. 1a through 1c show a cross-section, a top view, and an electrical circuit for the explanation of a first specific embodiment of the micromechanical component.
Figure 1B:
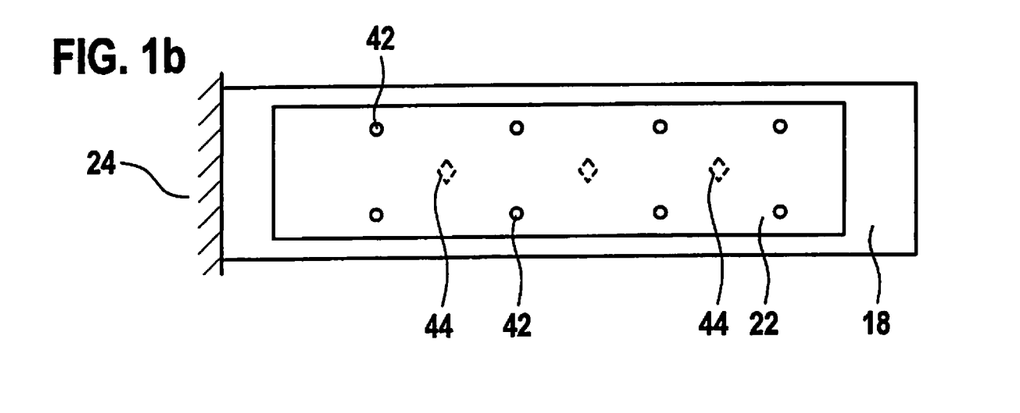
Figure 1C:
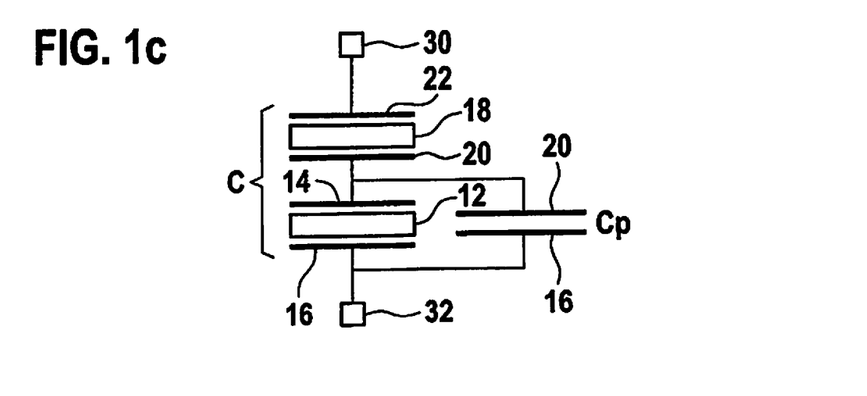

FIGS. 1a through 1c show a cross-section, a top view, and an electrical circuit for the explanation of a first specific embodiment of the micromechanical component.

The micromechanical component shown schematically in FIGS. 1a through 1c has at least one electromechanical flexible structure 10 that includes in each case a first piezoelectric layer 12 having a first outer electrode 14 and a first intermediate electrode 16 and a second piezoelectric layer 18 having a second intermediate electrode 20 and a second outer electrode 22. The respective first outer electrode 14 is situated on a first side of first piezoelectric layer 12. (The respective first outer electrode 14 can either contact the allocated first piezoelectric layer 12 or at least one additional material can be present between the respective first outer electrode 14 and the allocated first piezoelectric layer 12.) The first intermediate electrode 16 is situated on a second side, oriented away from the first side, of first piezoelectric layer 12. (The respective first intermediate electrode 16 can thus either contact the allocated first piezoelectric layer 12, or at least one further material can be present between the respective first intermediate electrode 16 and the allocated first piezoelectric layer 12.) The respective second piezoelectric layer 18 is situated on a side of first intermediate electrode 16 oriented away from first piezoelectric layer 12, and (at least) the respective second intermediate electrode 20 is present between second piezoelectric layer 18 and first intermediate electrode 16. Thus, the respective second intermediate electrode 20 is also situated on the side of first intermediate electrode 16 oriented away from first piezoelectric layer 12. (As is explained in more detail below, this however does not mean that the respective first intermediate electrode 16 contacts the respective second intermediate electrode 20.) Second outer electrode 22 is situated on a side of the allocated second piezoelectric layer 16 oriented away from the first intermediate electrode 16 (and second intermediate electrode 20). (The respective second outer electrode 22 can either contact the allocated second piezoelectric layer 18, or at least one further material can be present between the respective second outer electrode 22 and the allocated second piezoelectric layer 18.) Examples for the materials of components 12 through 22 are indicated below.

In FIGS. 1a through 1c, as an example only a (single) electromechanical flexible structure 10 is shown. However, it is to be noted that the micromechanical component can also have a plurality of electromechanical flexible structures 10, in particular a multiplicity of electromechanical flexible structures 10, each having components 12 through 22.

Preferably, the at least one electromechanical flexible structure 10 is situated on a mount 24 (shown schematically), such as a semiconductor substrate (in particular a silicon substrate), in such a way that at least one anchoring region 10a, contacting the mount 24, of the at least one electromechanical flexible structure 10 is anchored on mount 24, while a self-supporting region 10b of the allocated electromechanical flexible structure 10 can be displaced, by a force F exerted thereon (or a pressure exerted thereon), relative to the at least one anchoring region 10a of the allocated electromechanical flexible structure 10, with deformation at least of piezoelectric layers 12 and 18. The at least one electromechanical flexible structure 10 can for example be fashioned as a flexible beam or as a membrane. However, it is to be noted that the realization of the at least one electromechanical flexible structure 10 is not limited to particular shapes.

In the example of FIG. 1a, the force F causes a compression, indicated by arrow 26, in first piezoelectric layer 12, and an expansion, indicated by arrow 28, in second piezoelectric layer 18. A first partial voltage V1, caused by the deformation of first piezoelectric layer 12, is therefore directed opposite a second partial voltage V2 caused by the deformation of second piezoelectric layer 18. In order nonetheless to obtain an initial voltage $V_{total}$ that corresponds approximately to a sum of a magnitude of first partial voltage V1 and a magnitude of second partial voltage V2, second intermediate electrode 20 is electrically connected to first outer electrode 14 in such a way that second intermediate electrode 20 and first outer electrode 20 are at the same potential. (An advantageous possibility for realizing such an electrical connection of second intermediate electrode 20 to first outer electrode 14 is further described below.) Moreover, the micromechanical component has at least one first electrical contact 30, connected electrically to second outer electrode 22 of the at least one electromechanical flexible structure 10, and at least one second electrical contact 32 connected electrically to first intermediate electrode 16 of the at least one electromechanical flexible structure 10. The at least one initial voltage $V_{total}$ of the at least one electromechanical flexible structure 10 is thus easily picked off.

FIG. 1c shows an electrical circuit equivalent to the contacting of FIG. 1a. It can be seen that the overall capacitance $C_{total1}$ of lower piezoelectric layer 12 of electromechanical flexible structure 10 of FIG. 1a also has, in addition to a "piezoelectric" capacitance C of piezoelectric layer 12, a "parasitic" capacitance Cp of a capacitor made up of intermediate electrodes 16 and 20, according to the equation (Equation 1):

$$C_{total1} = C + C_p$$

For the initial voltage $V_1$, Equation 2 thus holds:

$$V_1 = \frac{Q(F)}{C + C_F}$$

where Q(F) is an overall charge generated by force F (due to the deformations of piezoelectric layers 12 and 18). The capacitance of the second piezoelectric layer remains unimpaired by the parasites, in accordance with Equation 3:

$$C_{total1} = C$$

There thus results output voltage V2 according to Equation 4:

$$V_2 = V_{total}$$

The overall output voltage of the sensor element results from the sum of the partial voltages, according to Equation 5:

$$V_{total} = V_1 + V_2 = \frac{Q(F)}{C + C_P} + \frac{Q(F)}{C}$$

The "parasitic" capacitance Cp thus contributes to the reduction of initial voltage $V_{total}$. However, if an intermediate volume 34 between first intermediate electrode 16 and second intermediate electrode 20 is at least partly filled with at least one electrically insulating material 36, and/or intermediate volume 34 has at least one intermediate gap 38 having air, at least one gas, or a vacuum therein, the "parasitic" capacitance Cp is (negligibly) low. Preferably, intermediate volume 34 between first intermediate electrode 16 and second intermediate electrode 20 is only partly filled with the at least one electrically insulating material 36, and has the at least one intermediate gap 38 having air, at least one gas, or a vacuum therein. While a complete filling of intermediate volume 34 between first intermediate electrode 16 and second intermediate electrode 20 would make the at least one electromechanical flexible structure 10 more rigid, the at least one electromechanical flexible structure 10 having the at least one intermediate gap 38 situated between intermediate electrodes 16 and 20, having air, the at least one gas, or a vacuum therein, remains flexible, and can therefore react to the force F with the desired strong deformation of its piezoelectric layers 12 and 18. Air, the at least one gas, or the vacuum, have no rigidity and are not electrical conductors. Their presence in intermediate volume 34 thus contributes to reducing the "parasitic" capacitance Cp while maintaining/improving a flexibility of the at least one electromechanical flexible structure 10. Moreover, the at least one intermediate gap 38 present between intermediate electrodes 16 and 20, having air, the at least one gas, or a vacuum therein, also enables an increase of a distance between first intermediate electrode 16 and second intermediate electrode 20 without reducing the flexibility of the at least one electromechanical flexible structure 10.

Preferably, at least one mechanical connecting element 40 made of the at least one electrically insulating material 36 is formed in intermediate volume 34 between first intermediate electrode 16 and second intermediate electrode 20, and extends from the first intermediate electrode 16 to second intermediate electrode 20. The at least one mechanical connecting element 40 brings about a "mechanical coupling" between the two intermediate electrodes 16 and 20, such that the force F exerted on second piezoelectric layer 18 is also transmitted to first piezoelectric layer 12, and thus causes deformations of both piezoelectric layers 12 and 18 as shown according to arrows 26 and 28. Preferably, the at least one mechanical connecting element 40 limits the at least one intermediate gap 38, which has air, the at least one gas, or a vacuum therein.

In the specific embodiment of FIGS. 1*a* through 1*c*, a plurality of mechanical connecting elements 40 are fashioned, preferably a multiplicity of mechanical connecting elements 40, as the at least one mechanical connecting element 40 in intermediate volume 34 between first intermediate electrode 16 and second intermediate electrode 20. Between each two adjacent mechanical connecting elements 40 there is respectively formed an intermediate gap 38 having air, the at least one gas, or a vacuum therein. Mechanical connecting elements 40 can in particular be fashioned as a "pattern of supporting islands." In this case, each of the mechanical connecting elements 40 has extensions in a plane parallel to the intermediate electrodes 14 and 20 that are smaller than their height/the distance between first intermediate electrode 14 and second intermediate electrode 20. Despite the "mechanical coupling" between intermediate electrodes 14 and 20 via mechanical connecting elements 40, in this way an overall contact surface of the "mechanical coupling" is minimized.

FIG. 1*b* shows a top view of second outer electrode 22. It can be seen that a multiplicity of etching accesses 42 extend through second outer electrode 22, second piezoelectric layer 18, and second intermediate electrode 20. As is explained in more detail below, etching accesses 42 can be used to structure mechanical connecting elements 40 and to form intermediate gaps 38. By a sealing (not shown) of etching accesses 32, the at least one gas or vacuum can moreover be "enclosed" in the at least one intermediate gap 38. In addition, dashed lines 44 show positions of mechanical connecting elements 40 under second intermediate electrode 20.

Figure 2A:
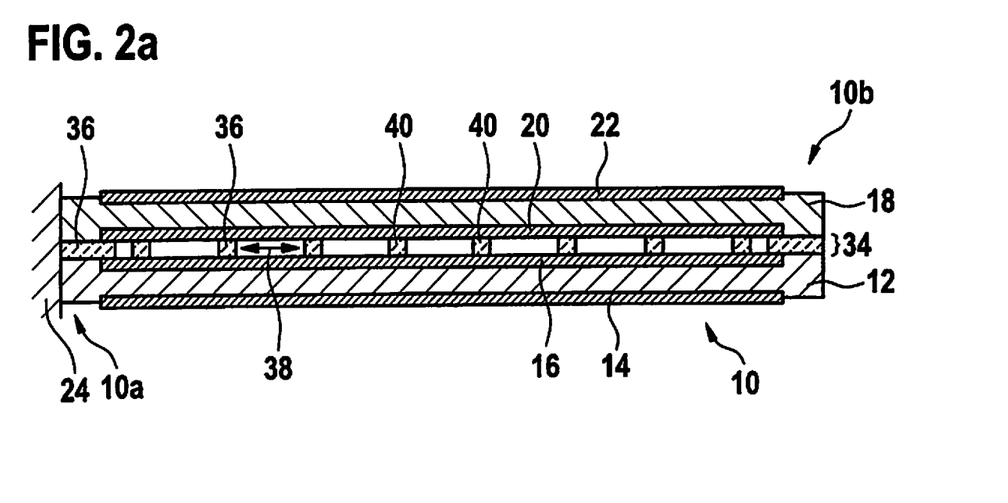
FIGS. 2a and 2b show a cross-section and a top view for the explanation of a second specific embodiment of the micromechanical component.
Figure 2B:
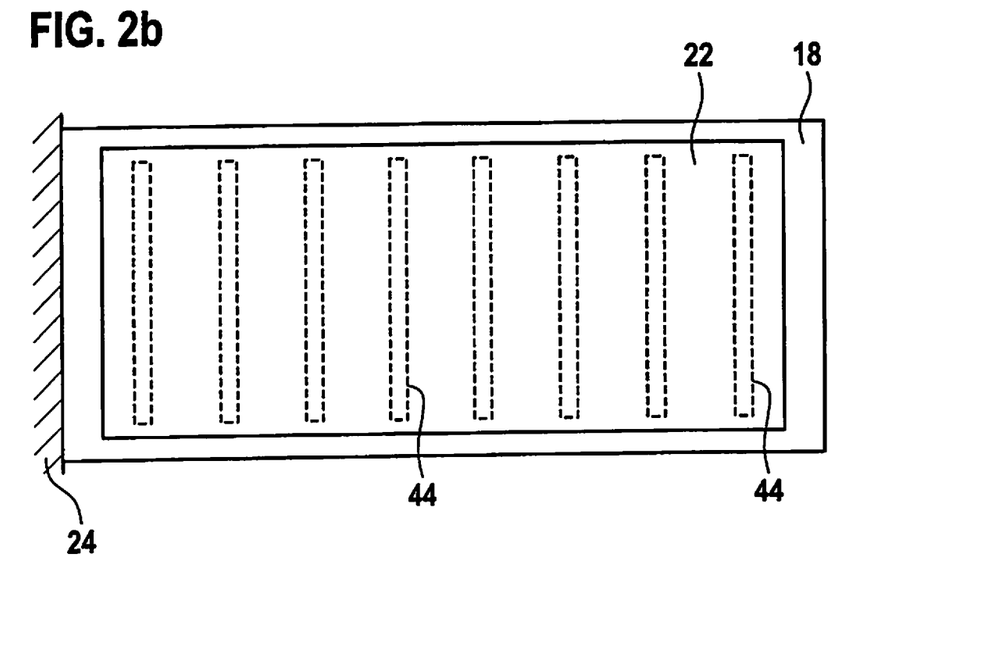

FIGS. 2*a* and 2*b* show a cross-section and a top view for the explanation of a second specific embodiment of the micromechanical component.

The micromechanical component shown schematically in FIGS. 2*a* and 2*b* differs from the previously described specific embodiment only in that mechanical connecting structures 40 are fashioned as intermediate walls that extend perpendicular to planes of intermediate electrodes 16 and 20. (In FIGS. 2*a* and 2*b*, etching accesses 42 are not shown for clarity.) With regard to further features of the specific embodiment of FIGS. 2*a* and 2*b*, reference is made to the micromechanical component described above.

The micromechanical components explained above are well-suited for a microphone or for a pressure and/or force sensor. Their electromechanical flexible structures 10 are sensitive pressure- and/or force-detecting elements that, when a force F is exerted thereon (or a pressure is exerted thereon), and in particular also when a sound wave impinges on the respective at least one electromechanical flexible structure 10, output an output voltage $V_{total}$ that is sufficiently high to be detected, amplified, and/or evaluated, through deformation of piezoelectric layers 12 and 18. As microphone or as pressure and/or force sensor, electromechanical flexible structures 10 thus have a high degree of sensitivity. As already explained above, their electromechanical flexible structures 10 also have a comparatively large degree of flexibility (or a relatively low degree of rigidity).

FIGS. 3*a* through 3*d* show cross-sections for the explanation of a specific embodiment of the production method for a micromechanical component.

The production method explained below can be carried out for example for the production of one of the micromechanical components described above. However, it is to be noted that the practicability of the production method described below is not limited to a production of these micromechanical components.

For the production of the micromechanical component, at least one electromechanical flexible structure 10 is formed. The at least one electromechanical flexible structure 10 is fashioned in each case having a first piezoelectric layer 12, a first outer electrode 14, a first intermediate electrode 16, a second intermediate electrode 20, a second piezoelectric layer 18, and a second outer electrode 22. Electrodes 14, 16, 20, and 22 can for example be made of aluminum, molybdenum (Mo), and/or tantalum (Ta). As material for first piezoelectric layer 12 and second piezoelectric layer 18, for example aluminum nitride (AlN) and/or lead zirconate titanate (PZT) can be used. However, here it is to be noted that the production of components 12 through 22 is not limited to the materials named here.

In the specific embodiment of FIGS. 3a through 3d, first the first outer electrode 14 is formed on a substrate surface of a semiconductor substrate 50, or on at least one layer 52 that partly covers the substrate surface, such as at least one first insulating layer 52. Semiconductor substrate 50 can for example include silicon, and can in particular be a silicon substrate 50. The at least one first insulating layer 52 can for example be a silicon dioxide layer and/or a silicon nitride layer ($Si_3N_4$ layer).

Figures 3A, 3B:
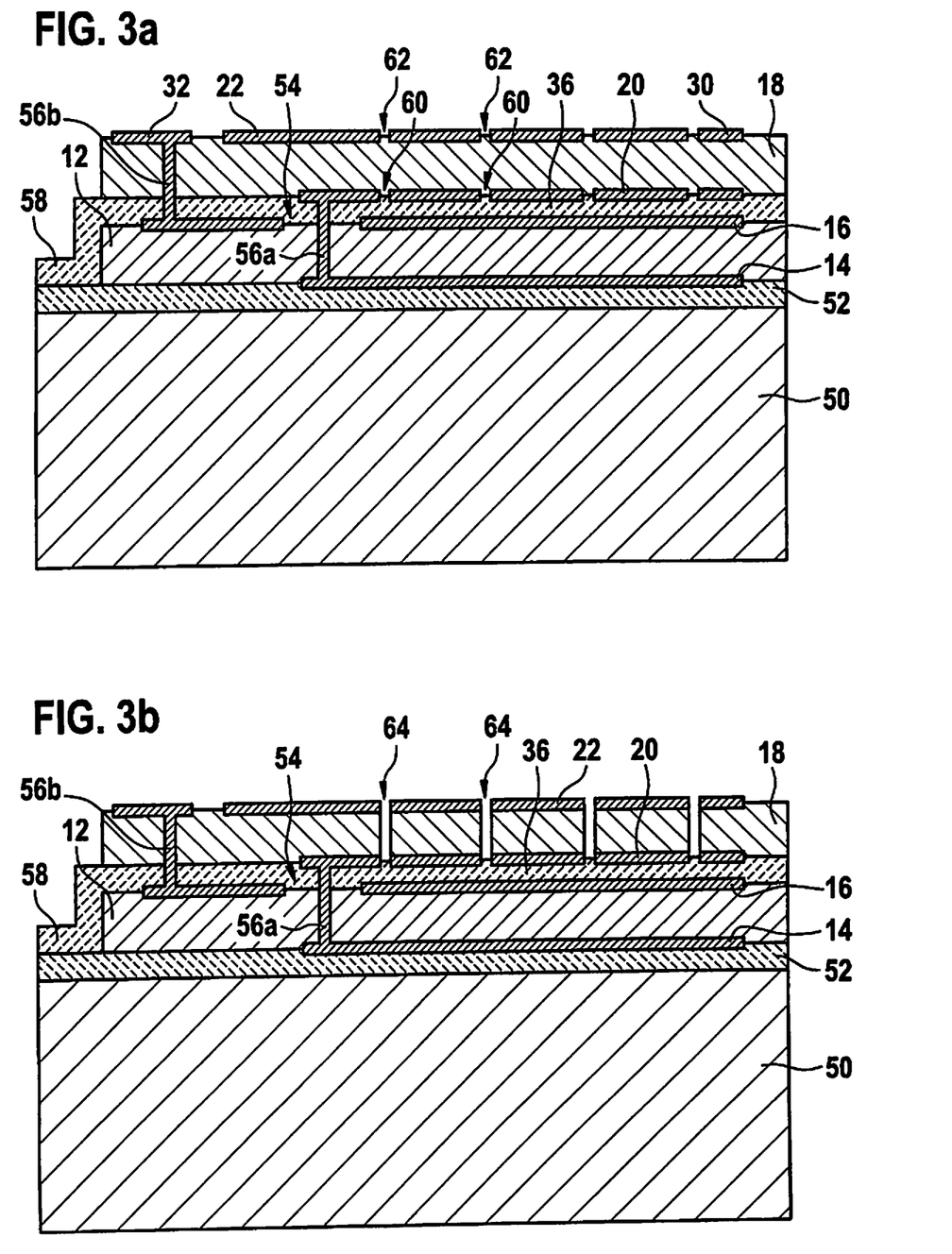
FIGS. 3a through 3d show cross-sections for the explanation of a specific embodiment of the production method for a micromechanical component.

Subsequently, first piezoelectric layer 12 is formed (directly or indirectly) on a side of first outer electrode 14 that is oriented away from substrate 50. While first outer electrode 14 is situated on a first side of first piezoelectric layer 12, second intermediate electrode 16 is situated (directly or indirectly) on a second side, oriented away from the first side, of first piezoelectric layer 12. Preferably, first intermediate electrode 16 is formed having a through-going opening 54 that permits a formation of a later first through-contact 56a so as to circumvent first intermediate electrode 16.

Preferably, before the formation of second intermediate electrode 20 on a side of first intermediate electrode 16 oriented away from first piezoelectric layer 12, there is deposited at least one (second) insulating layer 58 that at least partly covers components 12, 14, and 16. The at least one second insulating layer 58 can also be a silicon dioxide layer and/or a silicon nitride layer ($Si_3N_4$ layer).

Preferably, second intermediate electrode 20 is electrically connected to first outer electrode 14 in such a way that second intermediate electrode 20 and first outer electrode 14 are at the same potential. For this purpose, electrodes 14 and 20 can be connected to one another via a first through-contact 56a that extends from first outer electrode 14 to second intermediate electrode 20. In order to form first through-contact 56a, a trench is etched (before the formation of second intermediate electrode 20) through the at least one (second) insulating layer 58 and first piezoelectric layer 12, the trench running through opening 54 in first intermediate electrode 16. Subsequently, the trench is filled with at least one electrically conductive material, such as aluminum, molybdenum (Mo), and/or tantalum (Ta). A contact between first through-contact 56a and first intermediate electrode 16 is prevented due to the course of first through-contact 56a through opening 54 formed in first intermediate electrode 16. Thus, first intermediate electrode 16 is not set to the same potential as electrodes 14 and 20.

Second intermediate electrode 20 can subsequently be formed on the at least one second insulating layer 58. (Second intermediate electrode 20 is thus situated on the side oriented away from first piezoelectric layer 12 of first intermediate electrode 16, between second piezoelectric layer 18 and first intermediate electrode 16.) An intermediate volume 34 between first intermediate electrode 16 and second intermediate electrode 20 is therefore filled at least partly with at least one electrically insulating material 36 of the at least one (second) insulating layer 58. Preferably, second intermediate electrode 20 is formed having a multiplicity of through-going holes 60 that enable later etching accesses.

Second piezoelectric layer 18 is formed (directly or indirectly) on second intermediate electrode 20. Second piezoelectric layer 18 is thus formed on the side of first intermediate electrode 16 (and of second intermediate electrode 20) oriented away from first piezoelectric layer 12, whereby second intermediate electrode 20 is situated between second piezoelectric layer 18 and first intermediate electrode 16.

Optionally, before the formation of second outer electrode 22 a further second through-contact 56b is formed that facilitates a contacting of first intermediate electrode 16. For this purpose, a trench is etched through second piezoelectric layer 18 and the at least one (second) insulating layer 58, which trench is filled with at least one electrically conductive material, such as aluminum, molybdenum (Mo), and/or tantalum (Ta).

Second outer electrode 22 is formed (directly or indirectly) on a side oriented away from first intermediate electrode 16 and second intermediate electrode 20 of second piezoelectric layer 18. Second outer electrode 22 can also be formed having a multiplicity of through-going holes 62 whose positions preferably correspond to the positions of holes 60 in second intermediate electrode 20.

The finished layer construction of components 12 through 22, 50, 52, 56a, 56b, and 58 is shown in FIG. 3a. It can also be seen that on an outer side of the layer construction, oriented away from semiconductor substrate 50, at least one first electrical contact 30 and at least one second electrical contact 32 are present, such that during execution of the method steps described above the respective second outer electrode 22 of the at least one electromechanical flexible structure 10 is electrically connected to the at least one first electrical contact 30, and the respective first intermediate electrode 16 of the at least one electromechanical flexible structure 10 is electrically connected to the at least one second electrical contact 32.

FIG. 3b shows the layer construction after a structuring of a multiplicity of etching accesses 64 by etching away the material regions, exposed due to holes 62 in second outer electrode 22, of second piezoelectric layer 18. Etching accesses 64 can respectively extend from one of the holes 62 in second outer electrode 22 to one of the holes 60 in second intermediate electrode 20.

Figure 3C:
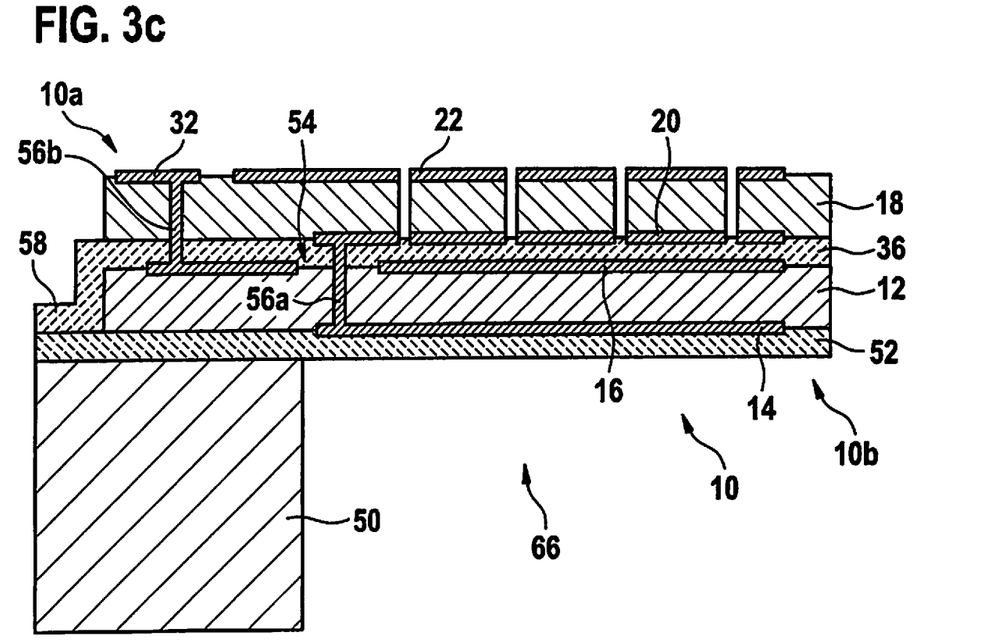

Subsequently, the at least one electromechanical flexible structure 10 can be at least partly separated by structuring an opening/cavern 66 through semiconductor substrate 50. In this way, in each case a self-supporting region 10b of the at least one electromechanical flexible structure 10 is separated, while at least one anchoring region 10a of the at least one electromechanical flexible structure 10 remains anchored on semiconductor substrate 50, as can be seen in FIG. 3c.

Figure 3D:
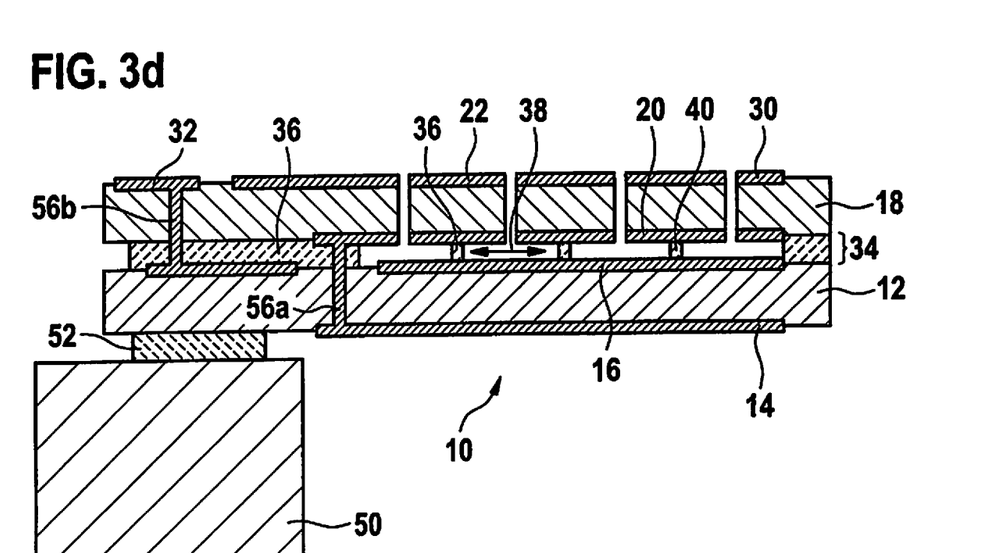

FIG. 3d shows the micromechanical component after a further etching step by which the at least one electrically insulating material 36 (in intermediate volume 34) is structured in the form of at least one mechanical connecting element 40 that extends from first intermediate electrode 16 to second intermediate electrode 20, and at least one intermediate gap 38 (later having air, at least one gas, or a vacuum therein) is formed in intermediate volume 34. This takes place in that through the multiplicity of etching accesses 64 that run through second outer electrode 22, second piezoelectric layer 18, and second intermediate electrode 20, the at least one electrically insulating material 36 (in intermediate volume 34) is partly removed, so that only the at least one mechanical connecting element 40 remains. In this way, the at least one mechanical connecting element 40 is structured out from the at least one electrically insulating material 36, which element extends from first intermediate electrode 16 to second intermediate electrode 20 and limits the at least one intermediate gap 38 (later having air, the at least one gas, or a vacuum therein). Optionally, etching accesses 54 can later be sealed with at least one deposited material (not shown), so that the at least one gas or vacuum is enclosed in the at least one intermediate gap between two adjacent mechanical connecting elements 40.

What is claimed is:

1. A micromechanical component, comprising:
   at least one electromechanical flexible structure, each of which includes:
      a first piezoelectric layer,
      a first outer electrode situated on a first side of the first piezoelectric layer,
      a first intermediate electrode situated on a second side, oriented away from the first side, of the first piezoelectric layer,
      a second piezoelectric layer situated on a side of the first intermediate electrode oriented away from the first piezoelectric layer, and
      a second outer electrode situated on a side of the second piezoelectric layer oriented away from the first intermediate electrode;
   wherein the at least one electromechanical flexible structure has in each case a second intermediate electrode that is situated on the side of the first intermediate electrode oriented away from the first piezoelectric layer, between the second piezoelectric layer and the first intermediate electrode,
   wherein an intermediate volume between the first intermediate electrode and the second intermediate electrode is (i) partly filled with at least one electrically insulating material and (ii) has at least one intermediate gap having air, at least one gas, or a vacuum therein,
   wherein at least one mechanical connecting element made of the at least one electrically insulating material is formed in the intermediate volume between the first intermediate electrode and the second intermediate electrode, the mechanical connecting element extending in each case from the first intermediate electrode to the second intermediate electrode and limiting the at least one intermediate gap having air, the at least one gas, or a vacuum therein.

2. The micromechanical component as recited in claim 1, wherein a plurality of mechanical connecting elements is fashioned, as the at least one mechanical connecting element, in the intermediate volume between the first intermediate electrode and the second intermediate electrode, and a respective intermediate gap, having air, the at least one gas, or a vacuum therein, being formed between each two adjacent mechanical connecting elements.

3. The micromechanical component as recited in claim 1, wherein the second intermediate electrode is electrically connected to the first outer electrode in such a way that the second intermediate electrode and the first outer electrode are at the same potential.

4. The micromechanical component as recited in claim 1, wherein the micromechanical component has at least one first electrical contact connected electrically to the respective second outer electrode of the at least one electromechanical flexible structure, and has at least one second electrical contact connected electrically to the respective first intermediate electrode of the at least one electromechanical flexible structure.

5. The micromechanical component as recited in claim 1, wherein a multiplicity of etching accesses extend through the second outer electrode, the second piezoelectric layer, and the second intermediate electrode.

6. A microphone, including a micromechanical component, the micromechanical component comprising:
   at least one electromechanical flexible structure, each of which includes:
      a first piezoelectric layer,
      a first outer electrode situated on a first side of the first piezoelectric layer,
      a first intermediate electrode situated on a second side, oriented away from the first side, of the first piezoelectric layer,
      a second piezoelectric layer situated on a side of the first intermediate electrode oriented away from the first piezoelectric layer, and
      a second outer electrode situated on a side of the second piezoelectric layer oriented away from the first intermediate electrode;
   wherein the at least one electromechanical flexible structure has in each case a second intermediate electrode that is situated on the side of the first intermediate electrode oriented away from the first piezoelectric layer, between the second piezoelectric layer and the first intermediate electrode,
   wherein an intermediate volume between the first intermediate electrode and the second intermediate electrode is (i) partly filled with at least one electrically insulating material and (ii) has at least one intermediate gap having air, at least one gas, or a vacuum therein,
   wherein at least one mechanical connecting element made of the at least one electrically insulating material is formed in the intermediate volume between the first intermediate electrode and the second intermediate electrode, the mechanical connecting element extending in each case from the first intermediate electrode to the second intermediate electrode and limiting the at least one intermediate gap having air, the at least one gas, or a vacuum therein.

7. A pressure and/or force sensor, including a micromechanical component, the micromechanical component comprising:
   at least one electromechanical flexible structure, each of which includes:
      a first piezoelectric layer,
      a first outer electrode situated on a first side of the first piezoelectric layer,
      a first intermediate electrode situated on a second side, oriented away from the first side, of the first piezoelectric layer,
      a second piezoelectric layer situated on a side of the first intermediate electrode oriented away from the first piezoelectric layer, and
      a second outer electrode situated on a side of the second piezoelectric layer oriented away from the first intermediate electrode;
   wherein the at least one electromechanical flexible structure has in each case a second intermediate electrode that is situated on the side of the first intermediate electrode oriented away from the first piezoelectric layer, between the second piezoelectric layer and the first intermediate electrode, wherein an intermediate volume between the first intermediate electrode and the second intermediate electrode is (i) partly filled with at least one electrically insulating material and (ii) has at least one intermediate gap having air, at least one gas, or a vacuum therein, wherein at least one mechanical connecting element made of the at least one electrically insulating material is formed in the intermediate volume between the first intermediate electrode and the second intermediate electrode, the mechanical connecting element extending in each case from the first intermediate electrode to the second intermediate electrode and limiting the at least one intermediate gap having air, the at least one gas, or a vacuum therein.

* * * * *

UNITED STATES PATENT AND TRADEMARK OFFICE
CERTIFICATE OF CORRECTION

PATENT NO. : 10,868,231 B2  
APPLICATION NO. : 15/665508  
DATED : December 15, 2020  
INVENTOR(S) : Thomas Buck et al.

Page 1 of 1

It is certified that error appears in the above-identified patent and that said Letters Patent is hereby corrected as shown below:

In Item (72) Inventors:  
Please change the second inventor:  
"Fabian Purki"  
To:  
-- Fabian Purkl --

Signed and Sealed this  
Thirteenth Day of April, 2021

Drew Hirshfeld  
*Performing the Functions and Duties of the*  
*Under Secretary of Commerce for Intellectual Property and*  
*Director of the United States Patent and Trademark Office*